(12) United States Patent
Obata et al.

(10) Patent No.: US 8,476,741 B2
(45) Date of Patent: Jul. 2, 2013

(54) SEMICONDUCTOR DEVICE

(75) Inventors: Susumu Obata, Yokohama (JP);
Takahiro Sogou, Yokohama (JP);
Yusaku Asano, Yokohama (JP); Takeshi Miyagi, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 171 days.

(21) Appl. No.: 13/009,212

(22) Filed: Jan. 19, 2011

(65) Prior Publication Data
US 2011/0215427 A1 Sep. 8, 2011

(30) Foreign Application Priority Data

Mar. 3, 2010 (JP) ................................. 2010-046561

(51) Int. Cl.
*H01L 23/58* (2006.01)
*H01L 21/31* (2006.01)
*H01L 21/4763* (2006.01)

(52) U.S. Cl.
USPC ............................ 257/642; 438/780; 438/623

(58) Field of Classification Search
USPC .. 257/108, 415, 684, 701, 642, 759; 438/623, 438/780
See application file for complete search history.

(56) References Cited

U.S. PATENT DOCUMENTS

| 8,076,739 B2 | 12/2011 | Schmollngruber et al. |
| 2009/0108381 A1* | 4/2009 | Buchwalter et al. .......... 257/415 |
| 2010/0176469 A1 | 7/2010 | Schmollngruber et al. |

FOREIGN PATENT DOCUMENTS

| JP | 2000-150510 | 5/2000 |
| JP | 2006-190804 | 7/2006 |
| JP | 2006-210530 | 8/2006 |
| JP | 2008-166752 | 7/2008 |
| JP | 2009-279733 | 12/2009 |
| WO | WO 2008/148654 A2 | 12/2008 |

OTHER PUBLICATIONS

Japanese Office Action issued Jan. 10, 2012, in Patent Application No. 2010-046561 (with English-language translation).

* cited by examiner

*Primary Examiner* — Calvin Lee
(74) *Attorney, Agent, or Firm* — Oblon, Spivak, McClelland, Maier & Neustadt, L.L.P.

(57) ABSTRACT

According to one embodiment, a semiconductor device includes: a substrate; an organic insulating film provided on the substrate; an inorganic insulating film formed thinner than the organic insulating film on the organic insulating film; a hollow sealing structure that is formed on the inorganic insulating film, and seals a MEMS element in an inside while ensuring a space between the hollow sealing structure itself and the MEMS element; a through hole formed so as to penetrate the organic insulating film and the inorganic insulating film; and a conductive member that is filled into the through hole, and electrically connects the MEMS element and an electrode formed by being filled into the through hole.

7 Claims, 6 Drawing Sheets

US 8,476,741 B2

SEMICONDUCTOR DEVICE

CROSS REFERENCE TO RELATED APPLICATIONS AND INCORPORATION BY REFERENCE

This application is based upon and claims the benefit of priority from prior Japanese Patent Application P2010-046561 filed on Mar. 3, 2010; the entire contents of which are incorporated by reference herein.

FIELD

Embodiments described herein relate generally to a semiconductor device.

BACKGROUND

In recent years, a semiconductor device has been used in a variety of fields. In particular, as miniaturization of apparatus on which the semiconductor device is mounted has been advanced, miniaturization of the semiconductor device has also been required. In order to meet such a requirement, chips are not placed on a plane, but are multiplied in layers, and are thereby formed as one semiconductor device.

In such a so-called integrated circuit as described above, it is necessary to achieve conduction among the chips thus stacked on one another. For example, a semiconductor device package structure has been proposed, in which through electrodes are provided in order to achieve the conduction among the stacked chips.

In recent years, a variety of micro machines have been used in many fields. Following this trend, a micro machining technology called a micro electro mechanical systems (MEMS) technology has been progressed. Moreover, a semiconductor device in which a MEMS device manufactured by using MEMS technology is connected onto a substrate has also been developed. In the case of the semiconductor device as described above, an interlayer insulating film is formed on a substrate on which a driver IC for driving the MEMS device is formed, and the MEMS device is formed on the interlayer insulating film concerned.

However, in particular, in the case of a semiconductor device including a MEMS device that processes a high frequency signal, it is necessary to ensure a sufficient distance between the substrate (driver IC) and the MEMS device in order to maintain high frequency characteristics of the MEMS device. Therefore, in the case where tetraethoxysilane (TEOS) or silicon oxide (SiO) film is used as the interlayer insulating film, for example, this interlayer insulating film is formed thick so as to obtain a thickness of 10 μm or more, and the distance between the substrate and the MEMS device is ensured.

However, though it is necessary to form the MEMS device at a position as apart as possible from the substrate in order to allow the MEMS device to exert the characteristics thereof, it takes time to deposit the required interlayer insulating film. Moreover, though the through electrodes must be provided in order to achieve the conduction between the substrate and the MEMS device, formation of through holes in this interlayer insulating film can cause such an unfavorable situation where manufacturing cost and manufacturing steps are increased as well as a manufacturing time.

DETAILED DESCRIPTION

In general, according to one embodiment, a semiconductor device includes: a substrate; an organic insulating film provided on the substrate; an inorganic insulating film formed thinner than the organic insulating film on the organic insulating film; a hollow sealing structure that is formed on the inorganic insulating film, and seals a MEMS element in an inside while ensuring a space between the hollow sealing structure itself and the MEMS element; a through hole formed so as to penetrate the organic insulating film and the inorganic insulating film; and a conductive member that is filled into the through hole, and electrically connects the MEMS element and an electrode formed by being filled into the through hole.

A description is made below in detail of first and second embodiments with reference to the drawings.

First Embodiment

Figure 1:
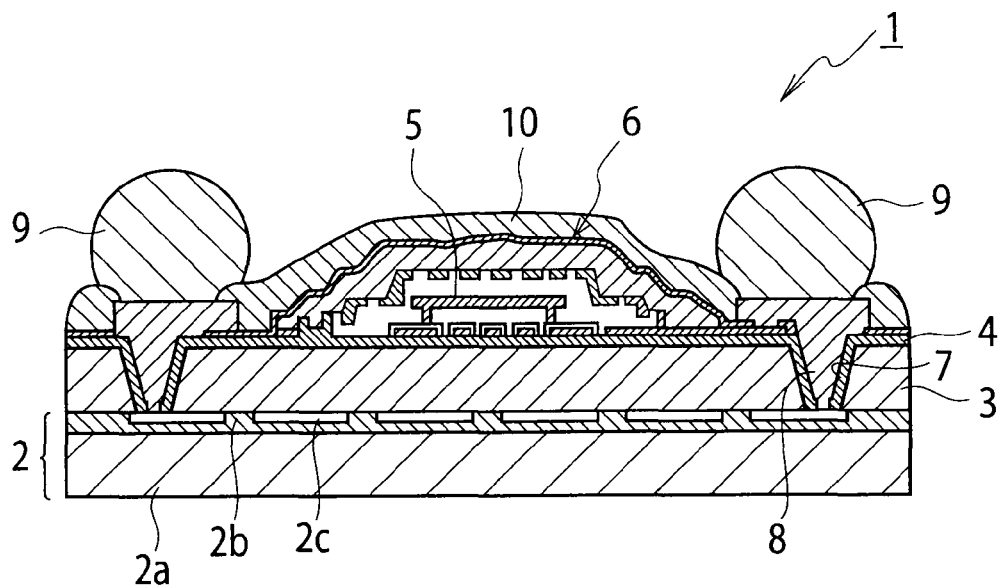
FIG. 1 is a cross-sectional view showing an entire configuration of a semiconductor device according to a first embodiment.

FIG. 1 is a cross-sectional view showing an entire configuration of a semiconductor device 1 according to a first embodiment. In the semiconductor device 1, an organic insulating film 3 and an inorganic insulating film 4 are individually formed on a substrate 2, and further, on the inorganic insulating film 4, a hollow sealing structure 6 that seals an MEMS element 5 in an inside while ensuring a space therebetween is formed. In the organic insulating film 3 and the inorganic insulating film 4, through holes 7 are formed so as to penetrate both the organic insulating film 3 and the inorganic insulating film 4. The through holes 7 are filled with conductive members 8, whereby electrodes formed on the substrate 2 and the MEMS element 5 are electrically connected to each other. Moreover, external electrodes 9 are connected to the conductive members 8, and through the external electrodes 9, the semiconductor device 1 is electrically connected to another apparatus. The connection portions between the hollow sealing structure 6 or the conductive members 8 and the external electrodes 9 are sealed with a solder resist 10.

The substrate 2 is mainly formed of a base material 2a composed, for example, of monocrystalline silicon. On a principal surface of the base material 2a, elements such as transistors, resistors and capacitors are arranged, and in addition, wires which connect the elements to one another are arranged, whereby integrated circuits are constructed. In FIG. 1, these integrated circuits are collectively shown as a wiring layer 2b. On a principal surface of the wiring layer 2b, a plurality of signal electrodes 2c, which are electrically connected to the wiring layer 2b and are to be connected to the outside, are formed. The substrate 2 has the above-mentioned configuration, and functions a driver IC as a whole.

The organic insulating film 3 is formed on (the principal surface side of) the substrate 2. As mentioned above, as a distance between the substrate 2 (driver IC) and the MEMS element 5 to be described later is larger, it becomes possible to maintain high frequency characteristics of the MEMS element 5 in a better state. Meanwhile, in order to form the hollow sealing structure 6 including the MEMS element 5, the inorganic insulating film 4 is essential. Therefore, heretofore, this inorganic insulating film has been formed thick, whereby the distance between the substrate 2 (driver IC) and the MEMS element 5 has been ensured.

However, as mentioned above, it takes both time and cost to form the inorganic insulating film thick. Accordingly, in the event of manufacturing the semiconductor device, it is not practical to form the inorganic insulating film thick in consideration of manufacturing efficiency, tact time and the like of the semiconductor device.

In this connection, in the first embodiment, in order to ensure the distance between the substrate 2 (driver IC) and the MEMS element 5, not the inorganic insulating film that requires time and cost for the formation thereof, but the organic insulating film formable at lower cost in a shorter time is employed. Meanwhile, the inorganic insulating film 4 having a required thickness is formed on this organic insulating film 3, whereby a condition is satisfied that the inorganic insulating film 4 is essential for forming the hollow sealing structure 6 including the MEMS element 5.

The through holes 7 to be described later are formed in the organic insulating film 3. Accordingly, for the organic insulating film 3, there is suitably employed a photosensitive polymer, through which it is easy to form the through holes 7, and for example, which is patternable by a photolithography technology. As the photosensitive polymer, for example, there can be mentioned polyimide resin, poly-phenylenebenzobisoxazole (PBO) resin, and fluorine resin with a low dielectric constant (for example, dielectric constant: 3 or less). Moreover, the hollow sealing structure 6 is formed above the organic insulating film 3 while interposing the inorganic insulating film 4 therebetween, and it is required that the organic insulating film 3 have high thermal resistance enough to endure a thermal load generated when this hollow sealing structure 6 is formed. Furthermore, a photosensitive polymer, which discharges less gas and absorbs less moisture, is more preferable. However, when this through holes 7 is formed by using the etching technique after the inorganic insulating film 4 described later is formed, non-photosensitive polymer can be adopted as the organic insulating film 3.

The organic insulating film 3 is formed on the substrate 2 (driver IC) by using spin coating, spray coating or a printing method. In consideration of the characteristics of the MEMS element 5, a thickness of the organic insulating film 3 to be formed is, for example, 5 μm or more, preferably, 10 μm or more.

The inorganic insulating film 4 is formed on the organic insulating film 3. As the inorganic insulating film 4, for example, a fluorine-added silicon oxide film (SiOF film) and a carbon-containing silicon oxide film (SiOC film) are suitably used besides the above-mentioned TEOS film and SiO film. The inorganic insulating film 4 is deposited by using a chemical vapor deposition (CVD) method, a plasma-enhanced chemical vapor deposition (PE-CVD) method, a physical vapor deposition (PVD) method or the like. This inorganic insulating film 4 is a film necessary to form the hollow sealing structure 6, and is formed with a thickness, for example, of 1 μm to 3 μm.

The MEMS element 5 is formed on the inorganic insulating film 4 by a general MEMS process, and is sealed by the hollow sealing structure 6 while ensuring a space between the hollow sealing structure 6 and the MEMS element 5. Note that the forming process of the MEMS element 5 includes, for example, such steps as an oxygen plasma ashing step for a resist film by using the photolithography technology, and a peeling liquid treatment step. However, since the organic insulating film 3 is covered with the inorganic insulating film 4, the organic insulating film 3 is not damaged even if the MEMS element 5 is formed above the same.

The through holes 7 are formed so as to penetrate the organic insulating film 3 and the inorganic insulating film 4. The through holes 7 are filled with the conductive members 8, whereby the substrate 2 (driver IC), the MEMS device 5 and the external electrodes 9 are electrically connected to one another. Hence, the through holes 7 includes openings individually in the organic insulating film 3 and the inorganic insulating film 4, which are located on the substrate 2 (driver IC) side. These openings are formed so that the opening of the organic insulating film 3 is smaller than the opening of the inorganic insulating film 4, and are formed in such a shape as getting narrower from the opening of the inorganic insulating film 4 toward the opening of the organic insulating film 3. Note that, in the first embodiment, the inorganic insulating film 4 is also formed on surfaces of the through holes 7. As the conductive members 8, for example, copper (Cu) by electroplating is suitably used.

For the external electrodes 9, for example, tin-silver (Sn—Ag) solder is suitably used. Note that a material of the external electrodes 9 is not limited to this tin-silver solder, and binary system alloys other than the tin-silver solder, and ternary system alloys or lead-free solder may be used.

Figure 2:
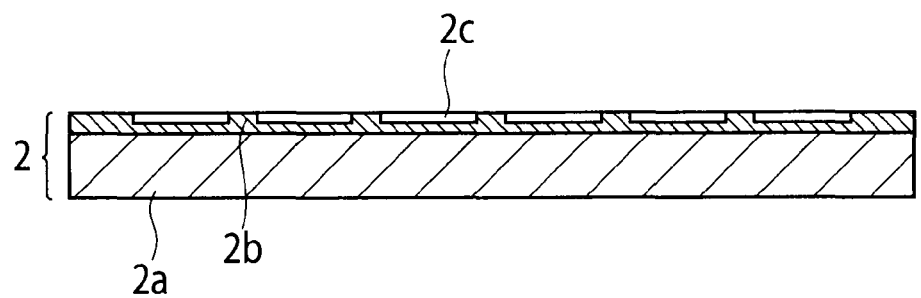
FIGS. 2 to 7 are cross-sectional views for explaining a manufacturing method of the semiconductor device according to the first embodiment.

Next, a description is made of a manufacturing method of the above-mentioned semiconductor device 1 by referring FIG. 2 to FIG. 7. First, the substrate 2 shown in FIG. 2 is prepared. This substrate 2 (driver IC) is in a state where the integrated circuits, the wiring layer 2b such as the wires which connect elements of the integrated circuits to one another, and the signal electrodes 2c are already manufactured on the principal surface of the base material 2a. Specifically, the substrate 2 (driver IC) is in a state of a silicon wafer for which a pretreatment process before a dicing step is almost terminated in a semiconductor manufacturing process. Note that, after the dicing step, such a substrate 2 (driver IC) is finely divided for forming the semiconductor devices 1.

Figure 3:
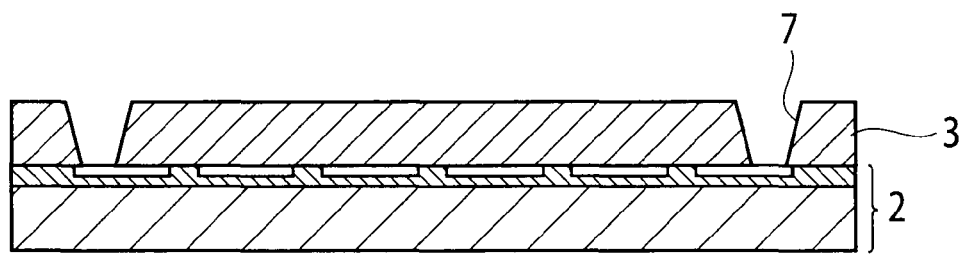

Subsequently, as shown in FIG. 3, the organic insulating film 3 is formed on the substrate 2 (driver IC), for example, by the spin coating method. As mentioned above, the deposition thickness of the organic insulating film 3 is, for example, 5 μm or more, preferably, 10 μm or more. However, in order to suppress a warp of the silicon wafer, the organic insulating film 3 is not deposited on the entire surface of the silicon wafer, but is patterned while excluding portions of dicing streets as regions to be cut by a dicer. Thereafter, the through holes 7 are formed by the photolithography technology.

Figure 4:
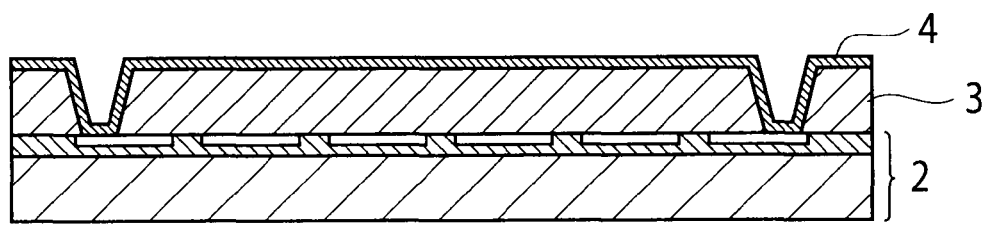

As shown in FIG. 4, on the organic insulating film 3 in which the through holes 7 are formed, the inorganic insulating film 4 is formed by using, for example, the PE-CVD method. As mentioned above, the deposition thickness of the inorganic insulating film 4 is, for example, approximately 3 μm. However, this inorganic insulating film 4 is formed since the inorganic insulating film 4 concerned is necessary to form the hollow sealing structure 6, and accordingly, the inorganic insulating film 4 just needs to be formed with at least a thickness required at the time of forming the hollow sealing structure 6.

In a state where the inorganic insulating film 4 is formed, the inorganic insulating film 4 is also deposited on the surfaces of the through holes 7. Moreover, the inorganic insulating film 4 is also deposited on openings formed on portions where the organic insulating film 3 is in contact with the substrate 2 (driver IC).

Figure 5:
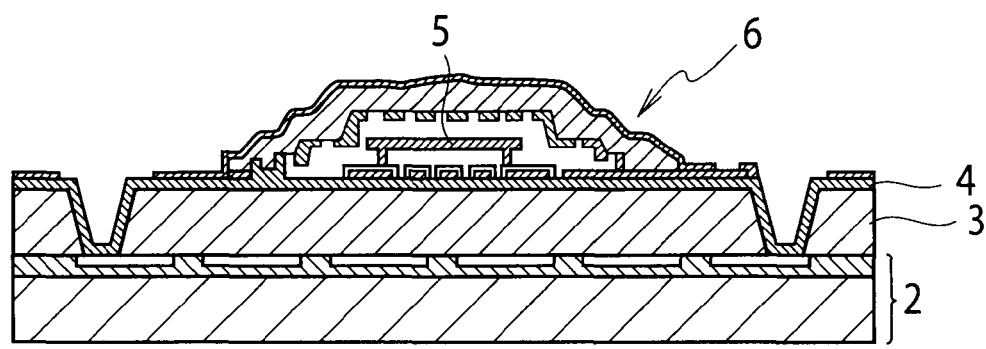

In this state, the hollow sealing structure 6 including the MEMS element 5 is formed on the inorganic insulating film 4 (refer to FIG. 5). Hence, on the periphery of such an area on which the hollow sealing structure 6 is formed, the through holes 7 covered with the inorganic insulating film 4 are present. Note that the forming step of the hollow sealing structure 6 is the already known matter, and accordingly, a description thereof is omitted here.

Figure 6:
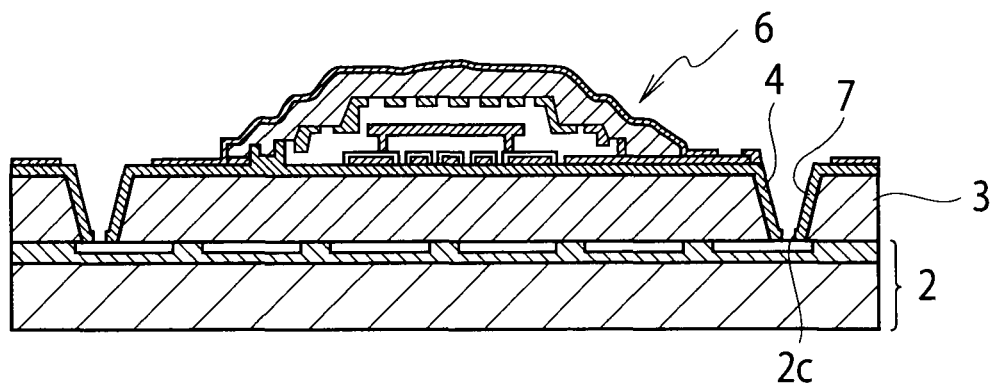

Then, as shown in FIG. 6, the inorganic insulating film 4 formed on bottom of the through holes 7 is cut away, and the signal electrodes 2c of the substrate 2 (driver IC) is exposed. This is because, if these portions are left covered with the inorganic insulating film 4, then the conduction among the substrate 2 (driver IC), the MEMS element 5 and the external electrodes 9 cannot be ensured even if the through holes 7 are filled with the conductive members 8. Moreover, openings communicating with the MEMS element 5 are also formed at the same time.

Figure 7:
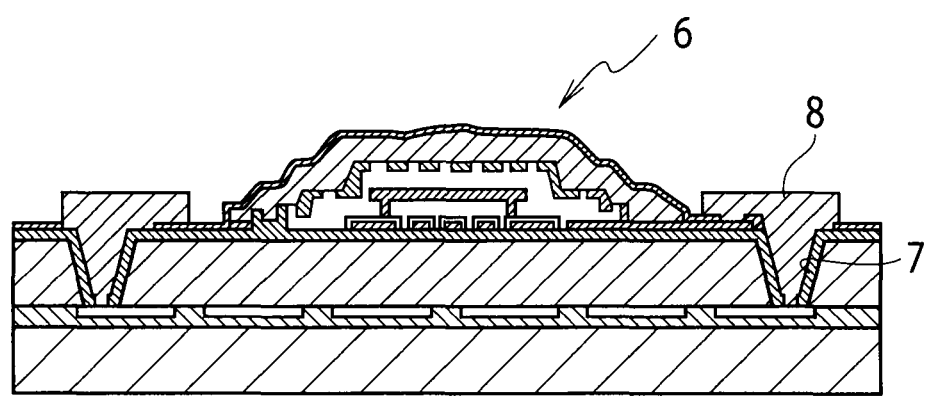

After the through holes 7 are filled with the conductive members 8 as shown in FIG. 7, the solder resist 10 is coated thereon, for example, by the spin coating method. By this step, the hollow sealing structure 6 and the like are sealed. Moreover, the solder resist 10 is patterned by the photolithography technology, the solder resist 10 on the conductive members 8 is peeled off, and the external electrodes 9 are formed on portions concerned.

The external electrodes 9 are subjected to reflow processing, are fused and solidified, and are thereby molded into a spherical shape as shown in FIG. 1. In such a way, the external electrodes 9 and the conductive members 8 can be electrically connected and mechanically joined to each other. The semiconductor device 1 as shown in FIG. 1 is manufactured by being subjected to these steps.

As already described, in the semiconductor device composed by forming the hollow sealing structure including the MEMS element on the driver IC (substrate), it is necessary to ensure the distance between the driver IC and the MEMS element in order to allow the MEMS device to exert and maintain the high frequency characteristics thereof. Moreover, it is necessary to deposit the inorganic insulating film in the event of forming the hollow sealing structure. In order to meet such requirements, the distance between the driver IC and the MEMS element is not ensured by the inorganic insulating film, but the organic insulating film is made to play a role of ensuring the distance between the driver IC and the MEMS element, whereby it becomes possible to reduce the manufacturing time and cost and the number of manufacturing steps. Moreover, the inorganic insulating film is deposited on the organic insulating film, whereby the formation of the hollow sealing structure is not hindered, either.

Hence, in accordance with the semiconductor device 1 according to the first embodiment, there can be provided a semiconductor device capable of preventing an unnecessary increase of the number of manufacturing steps and reducing the manufacturing time while adopting a device configuration capable of sufficiently exerting performance inherent in the MEMS device.

Second Embodiment

Next, a description is made of a second embodiment. Note that, in the second embodiment, the same reference numerals are assigned to the same constituent elements as the constituent elements described in the above-mentioned first embodiment, and a description of the same constituent elements is omitted since the description is duplicated.

Figure 8:
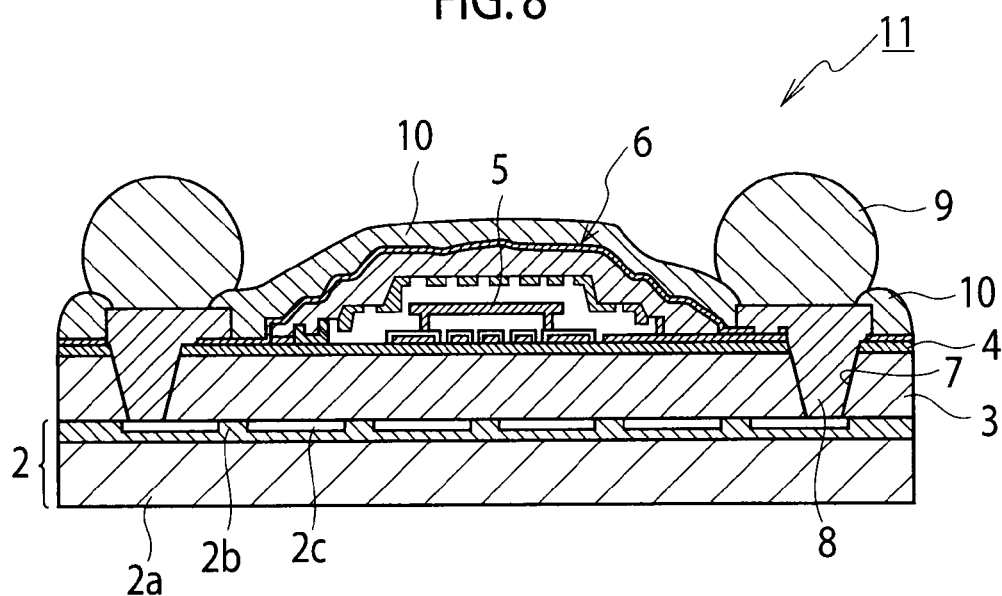
FIG. 8 is a cross-sectional view showing an entire configuration of a semiconductor device according to a second embodiment.

As shown in FIG. 8, a semiconductor device 11 in the second embodiment is different from the semiconductor device 1 described in the first embodiment in that the organic insulating film 4 is not deposited on the surfaces of the through holes 7.

The semiconductor device 11 having such a feature is different from the semiconductor device 1 also in terms of a manufacturing process thereof. Accordingly, a description is made of a manufacturing method of the semiconductor device 11 while referring to FIG. 9 to FIG. 15. Note that, as described while showing FIG. 2, the semiconductor device 11 is similar to the semiconductor device 1 in the first embodiment in that the substrate 2 (driver IC) is prepared, which is in a state where the integrated circuits, the wiring layer 2b such as the wires which connect the elements of the integrated circuits to one another, and the signal electrodes 2c are already manufactured on the principal surface of the base material 2a.

Figure 9:
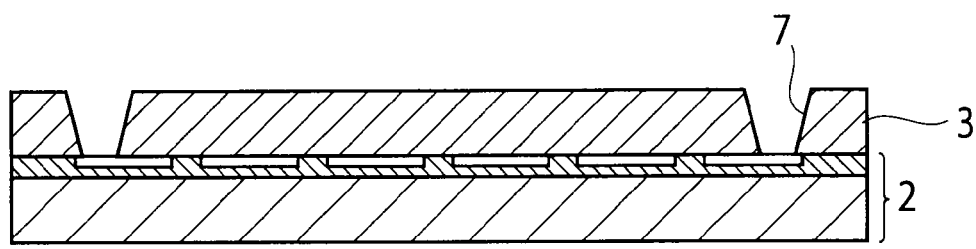
FIGS. 9 to 15 are cross-sectional views for explaining a manufacturing method of the semiconductor device according to the second embodiment.

First, as shown in FIG. 9, the organic insulating film 3 is formed on the substrate 2 (driver IC), for example, by the spin coating method, and the through holes 7 are formed therein by the lithography technology. As mentioned above, the thickness of the organic insulating film 3 is, for example, 5 μm or more, preferably, 10 μm or more. However, the thickness of the organic insulating film 3 is determined in consideration of not only performance of the semiconductor device 11 but also, as will be described later, grinding of the conductive member 8 after the conductive member 8 is formed on the organic insulating film 3.

Figure 10:
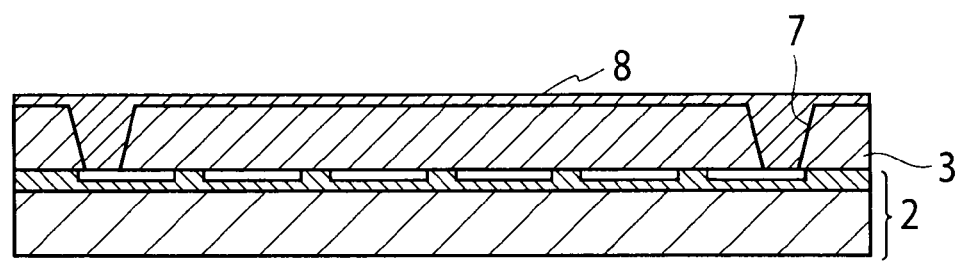

Thereafter, as shown in FIG. 10, the conductive member 8 is filled into the through holes 7, and is formed on the entire surface of the organic insulating film 3. Note that, though the surface of the organic insulating film 3 is described as the "entire surface", the conductive member 8 is formed thereon while excluding the regions of the dicing streets also here.

Figure 11:
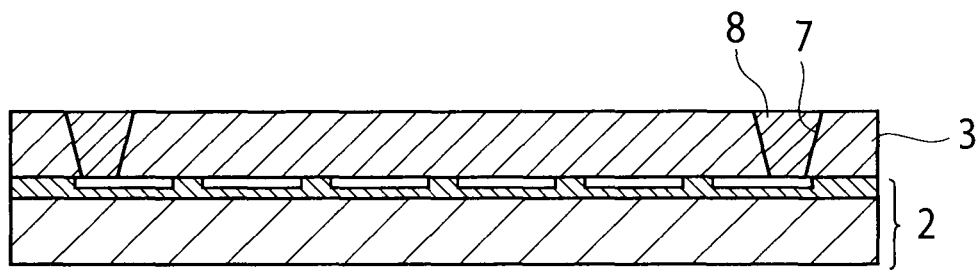

Then, as shown in FIG. 11, planarization processing (grinding) is performed so that only the conductive members 8 formed on the principal surface of the substrate 2 (driver IC) and filled into the through holes 7 from the conductive member 8 side can remain so as to be flush with the organic insulating film 3. At this time, the organic insulating film 3 appears on the peripheries of the conductive members 8.

Figure 12:
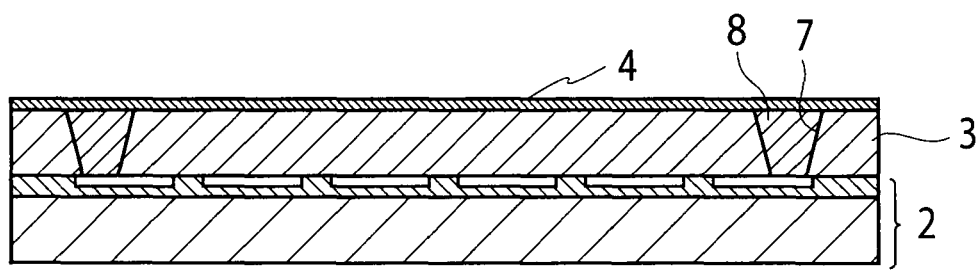

As shown in FIG. 12, on such a surface where the organic insulating film 3 and the conductive members 8 are flush with each other, the inorganic insulating film 4 is deposited, for example, by using the PE-CVD method. As mentioned above, the deposition thickness of the inorganic insulating film 4 is, for example, approximately 3 μm. However, this inorganic insulating film 4 is formed since the inorganic insulating film 4 concerned is necessary to form the hollow sealing structure 6, and accordingly, the inorganic insulating film 4 just needs to be formed with at least a thickness required at the time of forming the hollow sealing structure 6.

Figure 13:
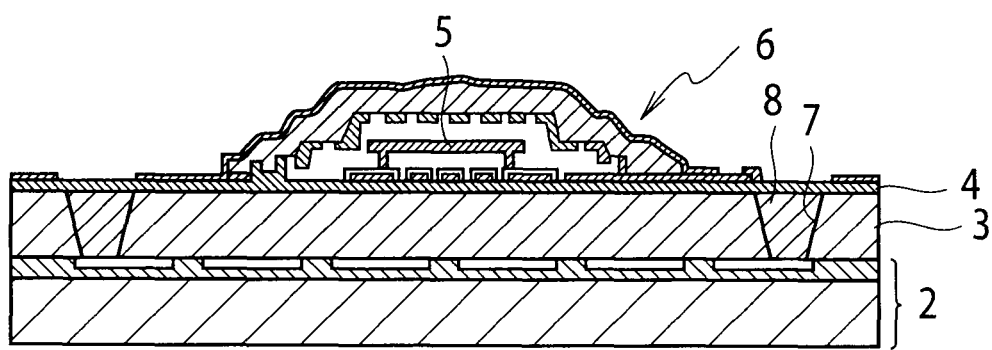

In this state, the hollow sealing structure 6 including the MEMS element 5 is formed on the inorganic insulating film 4 (refer to FIG. 13). The through holes 7 are covered with the inorganic insulating film 4. Accordingly, the hollow sealing structure 6 is formed on the substrate 2 (driver IC) covered with the inorganic insulating film 4. Note that the forming step of the hollow sealing structure 6 is the already known matter, and accordingly, a description thereof is omitted here.

Figure 14:
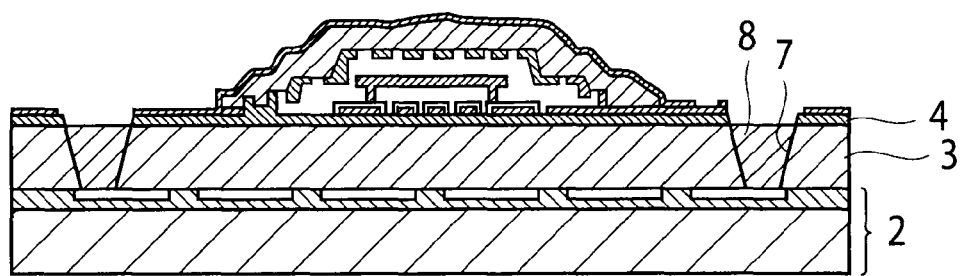

Then, as shown in FIG. 14, the inorganic insulating film 4 that covers the regions of the through holes 7 is opened, and the through holes 7, that is, the conductive members 8 are exposed. This is because, if these portions are left covered with the inorganic insulating film 4, then the conduction among the substrate 2 (driver IC), the MEMS element 5 and the external electrodes 9 cannot be ensured even if the through holes 7 are filled with the conductive members 8. Moreover, the openings communicating with the MEMS element 5 are also formed at the same time.

Figure 15:
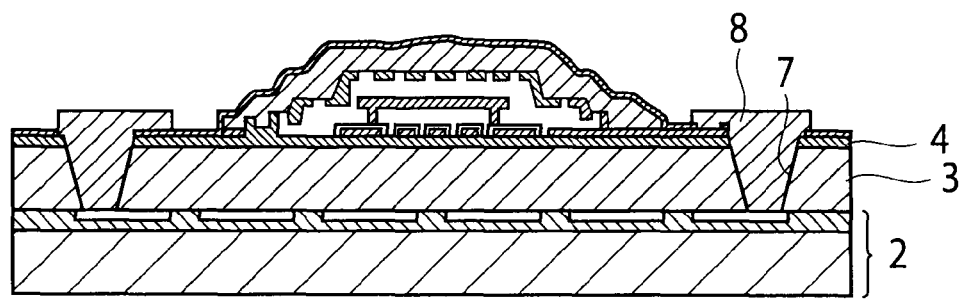

The conductive members 8 are formed so as to become capable of filling in the opened inorganic insulating film 4 and connecting also to the MEMS element 5 (refer to FIG. 15).

And then, the solder resist 10 is coated on the hollow sealing structure 6, the conductive members 8 and the like, for example, by the spin coating method. By this step, the hollow sealing structure 6 and the like are sealed. Moreover, the solder resist 10 is patterned by the photolithography technology, the solder resist 10 on the conductive members 8 is peeled off, and the external electrodes 9 are formed on portions concerned.

The external electrodes 9 are subjected to the reflow processing, are fused and solidified, and are thereby molded into a spherical shape as shown in FIG. 8. In such a way, the external electrodes 9 and the conductive members 8 can be electrically connected and mechanically joined to each other. The semiconductor device 11 as shown in FIG. 8 is manufactured by being subjected to these steps.

In the semiconductor device composed by forming the hollow sealing structure including the MEMS element on the driver IC (substrate), it is necessary to ensure the distance between the driver IC and the MEMS element in order to allow the MEMS device to exert and maintain the high frequency characteristics thereof. Moreover, it is necessary to deposit the inorganic insulating film in the event of forming the hollow sealing structure. In order to meet such requirements, the distance between the driver IC and the MEMS element is not ensured by the inorganic insulating film, but the organic insulating film is made to play a role of ensuring the distance between the driver IC and the MEMS element, whereby it becomes possible to reduce the manufacturing time and cost and the number of manufacturing steps. Moreover, the inorganic insulating film is deposited on the organic insulating film, whereby the formation of the hollow sealing structure is not hindered, either.

Moreover, in the semiconductor device 11 in the second embodiment, as mentioned above, at the time of forming the hollow sealing structure 6, the inorganic insulating film 4 is entirely deposited on the periphery of the region where the hollow sealing structure 6 is to be formed, and the periphery concerned is turned into a planar state, and does not have such openings as the through holes 7 formed thereon. Hence, in comparison with the case of the semiconductor device 1 described in the first embodiment, the hollow sealing structure 6 can be formed without caring the peripheral openings.

Hence, in accordance with the semiconductor device 11 according to the second embodiment, there can be provided a semiconductor device capable of preventing the unnecessary increase of the number of manufacturing steps and reducing the manufacturing time while adopting a device configuration capable of sufficiently exerting the performance inherent in the MEMS device.

Note that, in the event of manufacturing the semiconductor device 11, the semiconductor device 11 can also be manufactured not by the manufacturing method described in the above-mentioned second embodiment, but by a method to be described below.

Specifically, after the organic insulating film 3 is formed on the substrate 2 (driver IC), the through holes 7 are not provided soon, but the inorganic insulating film 4 is deposited on the organic insulating film 4, and the hollow sealing structure 6 is further formed thereon.

Thereafter, both of the organic insulating film 3 and the inorganic insulating film 4 are opened continuously by using the photolithography technology and the etching technology, whereby the through holes 7 are formed. And then, the through holes 7 are filled with the conductive members 8, followed by the coating of the solder resist 10 and the formation of the external electrodes 9, whereby the semiconductor device 11 is manufactured.

The semiconductor device 11 can be manufactured even by adopting the manufacturing flow as described above.

Other Embodiments

While certain embodiments have been described, these embodiments have been presented by way of example only, and are not intended to limit the scope of the inventions. Indeed, the novel apparatus described herein may be embodied in a variety of other forms; furthermore, various omissions, substitutions and changes in the form of the apparatus described herein may be made without departing from the spirit of the inventions. The accompanying claims and their equivalents are intended to cover such forms or modifications as would fall within the scope and spirit of the inventions.

What is claimed is:

1. A semiconductor device comprising:
    a driver IC;
    an organic insulating film provided on the driver IC;
    an inorganic insulating film formed thinner than the organic insulating film on the organic insulating film;
    a hollow sealing structure that is formed on the inorganic insulating film, and seals a MEMS element in an inside while ensuring a space between the hollow sealing structure itself and the MEMS element;
    a through hole formed so as to penetrate the organic insulating film and the inorganic insulating film; and
    a conductive member that is filled into the through hole, and electrically connects an external electrode formed on the driver IC and the MEMS element to each other.

2. The semiconductor device of the claim 1, wherein a thickness of the organic insulating film is thicker than a distance between the driver IC and the MEMS element necessary to allow the MEMS element to exert and maintain the high frequency characteristics.

3. The semiconductor device of the claim 1, wherein the through hole is formed so that an opening of the organic insulating film is smaller than an opening of the inorganic insulating film.

4. The semiconductor device of the claim 1, wherein the inorganic insulating film is formed on a surface of the through hole.

5. The semiconductor device of the claim 1, wherein the external electrode is formed on a side where the MEMS element is formed.

6. The semiconductor device of the claim 1, wherein the conductive member is connected to the driver IC and the external electrode.

7. The semiconductor device of the claim 1, wherein a part of the conductive member and the hollow sealing structure are sealed with a solder resist.

* * * * *